(12) United States Patent
Lemberg et al.

(10) Patent No.: US 9,720,604 B2
(45) Date of Patent: Aug. 1, 2017

(54) BLOCK STORAGE PROTOCOL TO RAM BYPASS

(71) Applicant: SanDisk Technologies Inc., Plano, TX (US)

(72) Inventors: Alex Lemberg, Kfar Saba (IL); Eyal Sobol, Kfar Saba (IL); Mahmud Asfur, Kfar Saba (IL)

(73) Assignee: SanDisk Technologies LLC, Plano, TX (US)

( * ) Notice: Subject to any disclaimer, the term of this patent is extended or adjusted under 35 U.S.C. 154(b) by 7 days.

(21) Appl. No.: 14/820,236

(22) Filed: Aug. 6, 2015

(65) Prior Publication Data

US 2017/0038982 A1 Feb. 9, 2017

(51) Int. Cl.
*G06F 3/06* (2006.01)
*G06F 12/02* (2006.01)
*G11C 11/00* (2006.01)
*G11C 7/10* (2006.01)

(52) U.S. Cl.
CPC .......... *G06F 3/0613* (2013.01); *G06F 3/0647* (2013.01); *G06F 3/0659* (2013.01); *G06F 3/0685* (2013.01); *G06F 12/0246* (2013.01); *G11C 11/005* (2013.01); *G06F 2212/7201* (2013.01); *G11C 7/1072* (2013.01)

(58) Field of Classification Search
CPC ...... G06F 3/061–3/0613; G06F 3/0659; G06F 3/0679; G06F 2003/0691; G06F 12/0246
See application file for complete search history.

(56) References Cited

U.S. PATENT DOCUMENTS

| | | |
|---|---|---|
| 6,570,791 B2 | 5/2003 | Roohparvar et al. |
| 8,296,467 B2 | 10/2012 | Lee et al. |
| 8,321,597 B2 | 11/2012 | Yu et al. |
| 8,331,121 B2 | 12/2012 | Hong |
| 8,504,793 B2 | 8/2013 | Fisher et al. |
| 2005/0204091 A1 | 9/2005 | Kilbuck et al. |
| 2006/0095622 A1 | 5/2006 | Rosner et al. |
| 2006/0184724 A1 | 8/2006 | Meir et al. |
| 2008/0010420 A1* | 1/2008 | Kao ............... G06F 12/0223 711/154 |
| 2008/0140919 A1* | 6/2008 | Torabi ............ G06F 13/1684 711/103 |
| 2011/0113184 A1* | 5/2011 | Chu ................... G06F 1/30 711/103 |
| 2013/0117632 A1* | 5/2013 | Fujinami ......... G06F 11/1012 714/763 |
| 2016/0139639 A1* | 5/2016 | Dash ................... G06F 1/26 714/773 |

FOREIGN PATENT DOCUMENTS

WO WO 2013/016723 A2 1/2013

* cited by examiner

*Primary Examiner* — Hal Schnee
(74) *Attorney, Agent, or Firm* — Brinks Gilson & Lione

(57) ABSTRACT

Methods and systems are provided where a memory controller for non-volatile memory transfers data to and from random access memory over a second double data rate bus, and a host system access the random access memory over a first double data rate bus. The memory controller may transfer the data in response to a command received by the memory controller from a host system via a block storage protocol bus. Alternatively or in addition, the memory controller may transfer the data as part of caching data internal to the non-volatile memory.

21 Claims, 2 Drawing Sheets

BLOCK STORAGE PROTOCOL TO RAM BYPASS

TECHNICAL FIELD

This disclosure relates to memory and, in particular, to random access memory and non-volatile solid state memory.

BACKGROUND

Dynamic random access memory (DRAM) may be accessed via an asynchronous interface or a synchronous interface. Synchronous dynamic random access memory (SDRAM) is DRAM that is accessed via a synchronous interface, such as a double data rate (DDR) interface. Mobile DDR (mDDR), which is sometimes referred to as Low Power DDR (LPDDR), is a type of SDRAM for mobile devices. Like SDRAM generally, mDDR is accessed via a synchronous interface, such as a DDR interface.

Static random-access memory (SRAM) is a type of semiconductor memory that uses bistable latching circuitry to store each bit. SRAM is considered static in that SRAM maintains values stored in it as long as it is powered. In contrast, in order for DRAM to maintain state, DRAM is periodically refreshed. SRAM may still be considered volatile because data is eventually lost when the memory is not powered. SRAM is generally more expensive than DRAM, but does not require refresh circuitry.

Non-volatile solid state memory may be memory that retains stored values even when power is disconnected from the non-volatile solid state memory. The non-volatile solid state memory may be flash memory, for example. Non-volatile solid state memory is typically accessed with a block storage protocol. For example, the block storage protocol may be a data access protocol that complies with a memory card standard for solid-state storage, such as MultiMediaCard (MMC), embedded card (eMMC), Secure Digital (SD), RS-MMC, MMCplus, MMCmobile, SecureMMC, SDIO SD, miniSD, and microSD. The non-volatile solid state memory may be accessed with the block storage protocol over a memory card bus that complies with the memory card standard.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Overview

Figure 1:
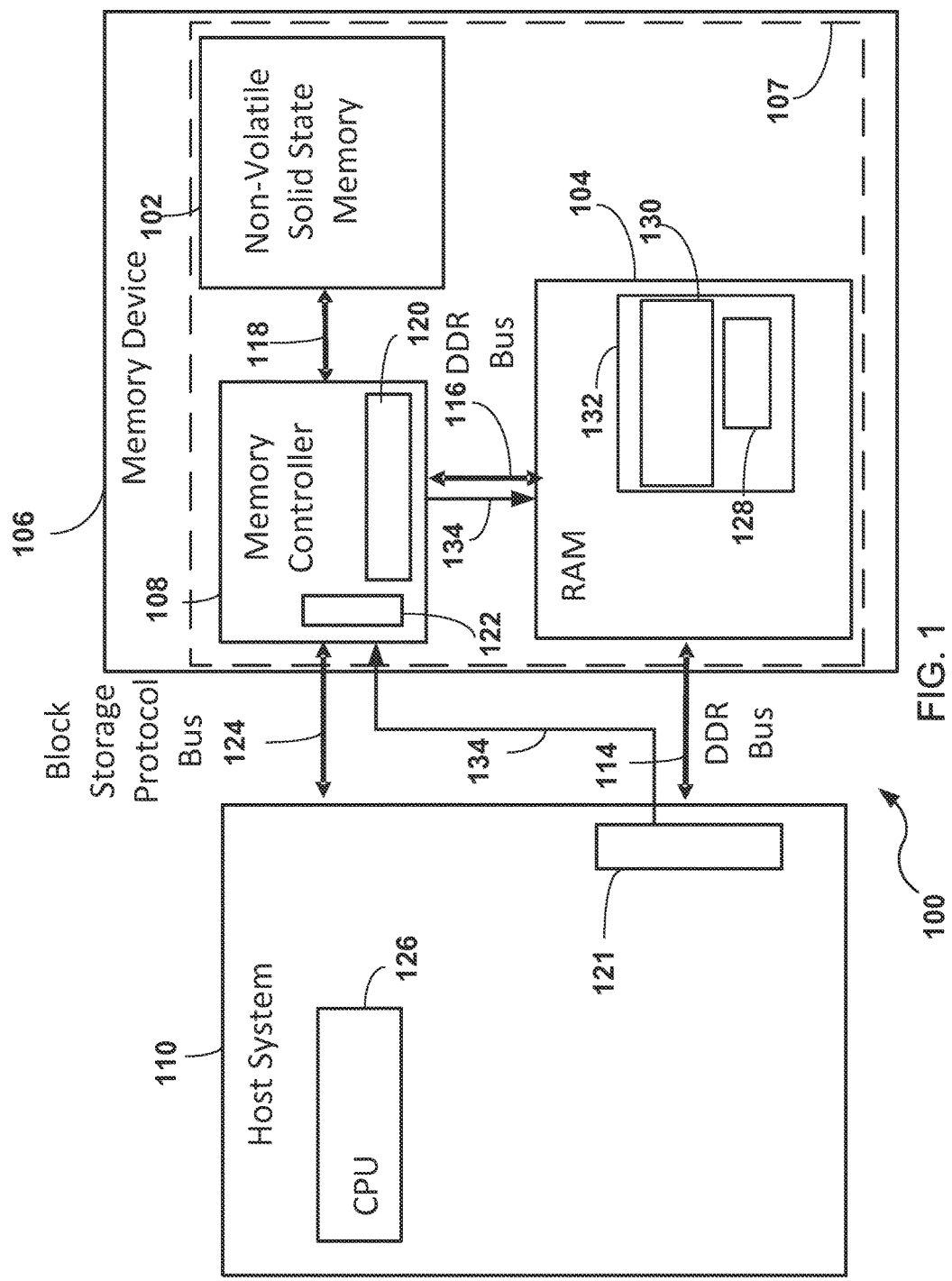
FIG. 1 illustrates an example of a system to leverage a combination of non-volatile solid state memory and random access memory (RAM) on a single memory device.

By way of introduction, in one embodiment, a memory device is provided that includes a random access memory and a non-volatile solid state memory. The memory device may further include a memory controller configured to access the non-volatile solid state memory, a first double data rate bus, a second double data rate bus, and a block storage protocol interface. The first double data rate bus may be coupled to the random access memory, where the random access memory is accessible by a host system via the first double data rate bus. The second double data rate bus may be coupled to the random access memory, where the random access memory is accessible by the memory controller via the second double data rate bus. The block storage protocol interface may be in communication with the memory controller. The memory controller may be configured to receive a command from the host system via the block storage protocol interface and to transfer data from the random access memory to the non-volatile solid state memory over the second double data rate bus in response to the command.

In another embodiment, a method to transfer data is provided. A command is received at a memory controller from a host system via a bus. Data is transferred by the memory controller between a non-volatile solid state memory and a random access memory independently of a central processing unit of the host system, via a first double data rate bus in accordance with the command, wherein the data in the random access memory is accessible by the host system through a second double data rate bus.

In yet another embodiment, a system is provided that includes a random access memory, a non-volatile solid state memory, and a memory controller. The random access memory may be accessible via a first double data rate bus and a second double data rate bus. The memory controller may be configured to read and write to the non-volatile solid state memory. In addition, the memory controller may be configured to access the random access memory through the second double data rate bus. The memory controller may be further configured to cache a data structure that is internal to the non-volatile solid state memory in the random access memory.

In some embodiments, the memory device includes a multi-chip package comprising the random access memory and the non-volatile solid state memory. Alternatively or in addition, the non-volatile solid state memory may comprise flash memory. The random access memory may be DRAM, for example.

In some embodiments, the block storage protocol may be a data access protocol specified by a memory card standard. Alternatively or in addition, the memory device may be a memory card.

Other embodiments are possible, and each of the embodiments may be used alone or together in combination. Accordingly, various embodiments will now be described with reference to the attached drawings.

Exemplary Embodiments

Accessing non-volatile solid state memory with a block storage protocol via a block storage protocol bus may be slower than accessing RAM via a DDR interface. Some embodiments described herein may leverage a combination of the non-volatile solid state memory and the RAM in order to obtain improved access times. For example, the RAM may be accessible by a host system through a first DDR bus. A memory controller may transfer data between the RAM and the non-volatile solid state memory via a second DDR bus in response to a command received from the host system over a block storage protocol bus.

SRAM, which is often used by memory controllers for caching data, may be more expensive than RAM. Some embodiments described herein may leverage a combination of the non-volatile solid state memory and the RAM in order to provide more cache memory to memory controllers. For example, space in the RAM may be provided to the memory controller to use as cache.

FIG. 1 illustrates an example of a system 100 to leverage a combination of a non-volatile solid state memory 102 and a random access memory (RAM) 104 on a single memory device 106. The system 100 may include the memory device 106. Alternatively or in addition, the system 100 may include a host system 110.

The memory device 106 may include the non-volatile solid state memory 102, the RAM 104, a memory controller 108, a first double data rate (DDR) bus 114 through which the RAM 104 is accessible by the host system 110, and a second double data rate (DDR) bus 116 through which the RAM is accessible by the memory controller 108.

The memory device 106 may be in any form that includes the non-volatile solid state memory 102, the RAM 104, and the second DDR bus 116 between the memory controller 108 and the RAM 104. For example, the memory device 106 may be in the form of a memory card for solid-state storage, such as MultiMediaCard (MMC), embedded card (eMMC), Secure Digital (SD), RS-MMC, MMCplus, MMCmobile, SecureMMC, SDIO SD, miniSD, and microSD. Alternatively or in addition, the memory device 106 may be in the form of a flash drive, a universal serial bus (USB) drive, or any other a solid state storage device. Alternatively or in addition, the memory device 106 may include a printed circuit board (PCB) card that comprises the non-volatile solid state memory 102, the RAM 104, and in some examples, one or more additional components, such as the memory controller 108.

In some examples, the memory device 106 may include a multi-chip package (MCP) 107. The MCP 107 may include the RAM 104 and the non-volatile solid state memory 102, and in some configurations, additional components such as the memory controller 108, the first DDR bus 114 and the second DDR bus 116. The MCP 107 may also be referred to as a multi-chip module (MCM) or a hybrid integrated circuit. The MCP 107 may be an electronic assembly, such as a package with a number of conductor terminals or "pins", where multiple integrated circuits (ICs), semiconductor dies, and/or other discrete components are integrated, typically onto a unifying substrate, so that the integrated component may be treated as a single IC. For example, the RAM 104 and the non-volatile solid state memory 102 may be integrated physically into a stack.

The non-volatile solid state memory 102 may be any semiconductor memory that maintains state when power is disconnected from the semiconductor memory. Examples of the non-volatile solid state memory 102 may include non-volatile memory such as resistive random access memory ("ReRAM"), electrically erasable programmable read only memory ("EEPROM"), flash memory (which may also be considered a subset of EEPROM), ferroelectric random access memory ("FRAM"), and magnetoresistive random access memory ("MRAM"), and other semiconductor elements capable of storing information. Each type of the non-volatile solid state memory 102 may have different configurations. For example, flash memory may be configured in a NAND or a NOR configuration.

The RAM 104 may be any dynamic random access memory. Dynamic random access memory (DRAM) may be accessed via an asynchronous interface or a synchronous interface. Examples of the RAM 104 may include synchronous dynamic random access memory (SDRAM) and mobile DDR (mDDR), which is sometimes referred to as Low Power DDR (LPDDR).

The memory controller 108 may be in a form of a device that interfaces with a host system, such as the host system 110 illustrated in FIG. 1, and that transmits command sequences, such as read, program, and erase operations, to the non-volatile solid state memory 102. For example, the memory controller 108 may be in the form of a flash controller, an eMMC controller, a MMC controller, or any other type of controller for semiconductor memory. The memory controller 108 may transfer the command sequences to the non-volatile solid state memory 102 over a communication channel 118.

The memory controller 108 may include a DDR interface 120 and a block storage protocol interface 122. The DDR interface 120 may be an interface through which the memory controller 108 accesses the RAM 104 over the DDR bus 116. The block storage protocol interface 122 may be an interface through which the host system 110 communicates with the memory controller 108 over a block storage protocol bus 124.

A block storage protocol may be any protocol in which data is accessed by logical block addresses (LBAs). An example of the block storage protocol may be any data access protocol specified by a memory card standard, such as MultiMediaCard (MMC), embedded card (eMMC), Secure Digital (SD), RS-MMC, MMCplus, MMCmobile, SecureMMC, SDIO SD, miniSD, and microSD. Other examples of the block storage protocol may include any data access protocol specified by a storage interface standard, such as Serial ATA (SATA), eSATA, SATA Express, Small Computer System Interface (SCSI), Internet Small Computer System Interface (iSCSI), Fibre Channel, and Fibre Channel over Ethernet (FCoE), or any other data access protocol in which data is accessed by logical data blocks.

The block storage protocol interface 122 may be any interface that provides communication compliant with the block storage protocol. For example, the block storage protocol interface 122 may be an eMMC interface, a SATA interface, a Fibre Channel interface, or any other compliant interface.

The block storage protocol bus 124 may be any bus or interconnect over which commands compliant with the block storage protocol may be transmitted. For example, the block storage protocol bus 124 may be a memory card bus, an eMMC bus, a PCI bus, a PCI Express bus, a USB, or an Ethernet interconnect.

The host system 110 may include a central processing unit (CPU) 126 and a DDR interface 121. Examples of the host system 110 may include a mobile device, a cell phone, a smart phone, a tablet computing device, a desktop computer, a laptop computer, or any other computing device.

The DDR interface 121 of the host system 110 may be a first DDR interface and the DDR interface 120 of the memory controller 108 may be a second DDR interface. The DDR interface 120 or 121 may be any component that reads and writes data over a DDR bus on both rising and falling edges of a clock signal. For example, the clock signal may be a clock signal on the first DDR bus 114 or the second DDR bus 116. In one example, each of the first DDR interface 121 and the second DDR interface 120 may be a respective port of a dual-port RAM interface, such as a dual-port LPDDR (low power DDR) interface. In a second example, each of the first DDR interface 121 and the second DDR interface 120 is a discrete component separate from each other.

The first DDR bus 114 and the second DDR bus 116 may be any double data rate bus. Examples of the first DDR bus 114 and the second DDR bus 116 may include DDR, DDR1 SDRAM, DDR2 SDRAM, DDR3 SDRAM, and DDR4 SDRAM specified by the JEDEC Solid State Technology Association, formerly known as the Joint Electron Device Engineering Council (JEDEC). Alternatively or in addition, the first DDR bus 114 and the second DDR bus 116 may be a double data rate bus that complies with any other standard from any other organization. The first DDR bus 114 and the second DDR bus 116 may each include at least a 64 bit wide data bus. In other examples, the first DDR bus 114 and the second DDR bus 116 may include a smaller data bus. The first DDR bus 114 and the second DDR bus 116 may have a faster transfer rate or higher clock frequency than the block storage protocol bus 124.

The first DDR bus 114 may be configured to couple to an address bus (not shown) of the CPU 126 of the host system 110. For example, the first DDR interface 121 included in the host system 110 may be on the address bus of the CPU 126.

During operation of the system 100, both the host system 110 and the memory controller 108 may access RAM 104. The host system 110 may treat the RAM 104 as primary memory. For example, the host system 110 may access data in the RAM 104 through the first DDR interface 121. The first DDR interface 121 may access the data in the RAM 104 over the first DDR bus 114.

The memory controller 108 may have direct data access to the RAM 104 via the second DDR interface 120. In other words, the memory controller 108 may transfer data between the RAM 104 and the non-volatile solid state memory 102 independently of the CPU 126 in the host system 110. In such a configuration, the CPU 126 and the memory controller 108 may transfer data between each other through the RAM 104 instead of over the block storage protocol bus 124.

For example, the memory controller 108 may be configured to read and write data directly from and to the RAM 104 using the second DDR interface 120. Accordingly, the CPU 126 of the host system 110 may be free to perform other operations in parallel to the memory controller 108 accessing to the RAM 104 via the second DDR interface 120.

The memory controller 108 may receive a command from the host system 110 the over the block storage protocol bus 124, where the command conforms to the block storage protocol. The command may be a write command. The write command may indicate that data is to be written to a logical block address (LBA) in the non-volatile solid state memory 102. The write command may indicate a location in the RAM 104 where the data is currently stored. For example, the write command may include a memory address of the data stored in the RAM 104.

In response to receipt of the command, the memory controller 108 may perform the command. To perform the write command, for example, the memory controller 108 may convert the LBA to a physical address of a storage location in the non-volatile solid state memory 102. The memory controller 108 may copy the data from the location in the RAM 104 over the second DDR bus 116 to the physical location in the non-volatile solid state memory 102.

In another example, the command may be a read command. The read command may indicate that data is to be read from a logical block address (LBA) in the non-volatile solid state memory 102. The read command may also indicate a location in the RAM 104 where the data is to be stored after it read from the non-volatile solid state memory 102. For example, the read command may include a memory address in the RAM 104 where the data is to be stored. To perform the read command, the memory controller 108 may convert the LBA to a physical address in the non-volatile solid state memory 102. The memory controller 108 may read the data at the physical location from the non-volatile solid state memory 102, and copy the data to the location in the RAM 104 over the second DDR bus 116.

The command may include the memory address for the location in the RAM 104 where data is to be read from or written to. Alternatively or in addition, the memory address may be predetermined. For example, a portion 130 of the RAM 104 may be reserved as a cache area, and a cache identification command that identifies the memory address of the reserved portion 130 of the RAM 104 may be sent from the host system 110 to the memory controller 108. In another example, the cache identification command may be sent from the memory controller 108 to the host system 110. The subsequently sent read command or write command may operate on the reserved portion 130 of the RAM 104 that was identified in the cache identification command.

The memory address, which is the memory address for the location in the RAM 104 where data is to be read from or written to, may be any address that identifies a memory location. The memory address may include bits representing an offset in bytes, words, or any other unit. Alternatively or in addition, the memory address may include a chip identifier. The chip identifier may identify one of multiple chips in the RAM 104. For example, the chip identifier may be in the form of a chip select signal 134 or signals.

While the memory controller 108 transfers data between the RAM 104 and the non-volatile solid state memory 102, the CPU 126 of the host system 110 may be free to perform other operations. The CPU 126 may, in some configurations, access the RAM 104 at the same time that the memory controller 108 accesses the RAM 104.

The CPU 126 may control the chip select signal 134 or signals, which may pass from the host system 110 to the memory controller 108. The CPU 126 may cause the chip select signal 134 or signals to be transmitted over the first DDR interface 121 or over any communication line from the host system 110 to the memory device 106. The memory controller 108 may feed the chip select signal 134 received from the CPU 126 to the second DDR interface 120. Alternatively or in addition, when accessing the RAM 104, the memory controller 108 may control a chip select signal 134 on a communication line from the memory controller 108 to the second DDR interface 120 independently of the chip select signal 134 received from the CPU 126. For example, if the memory controller 108 is processing a command that directs the memory controller 108 to access the memory address identified by the command, then the memory controller 108 may set the chip select signal 134 provided to the second DDR interface 120 in accordance with the identified memory address.

Where each of the first DDR interface 121 and the second DDR interface 120 is a respective port of a dual-port RAM interface, then concurrency issue avoidance logic of the dual-port RAM interface may handle any concurrency issues associated with the memory controller 108 and the CPU 126 both accessing the RAM 104. Logic similar to the concurrency issue avoidance logic of a dual-port RAM interface may be included in the system 100 when each of the first DDR interface 121 and the second DDR interface 120 is a discrete component.

Viewed from the perspective of the host system 110, the host system 110 may store data at a memory location in the RAM 104 via the first DDR interface 121 and the first DDR bus 114. The host system 110 may store the data at the memory location so that the memory controller 108 of the memory device 106 may subsequently copy the data to the non-volatile solid state memory 102. Alternatively, the host system 110 may store the data at the memory location for any other reason. The host system 110 may transmit a write command, which conforms to the block storage protocol, to the memory device 106, where the write command indicates that the data stored at the memory location in the RAM 104 is to be copied to one or more LDAs in the non-volatile solid state memory 102. The memory controller 108 may perform the write command by copying the data directly from the RAM 104 via the second DDR bus 116 instead of receiving the data over the block storage protocol bus 124.

Alternatively or in addition to the write command, the host system 110 may transmit a read command, which conforms to the block storage protocol, to the memory device 106, where the read command indicates that data stored at one or more LDAs in the non-volatile solid state memory 102 is to be copied to a memory location in the RAM 104. The memory controller 108 may perform the read command by copying the data directly from the non-volatile solid state memory 102 to the memory location in the RAM 104 via the second DDR bus 116. The host system 110 may copy the data from the memory location in the RAM 104 via the first DDR bus 114 to another memory location.

During operation of the system 100, the memory controller 108 may use the RAM 104 as an internal cache. For example, the memory controller 108 may cache a data structure 128, which is internal to the non-volatile solid state memory 102, in the random access memory 104. Although memory controllers may include volatile memory, such as SRAM, the included volatile memory may be relatively small, such as on the order of 10 kilobytes. In contrast, the RAM 104 available to the host system 110, and which may be shared with the memory controller 108, may substantially larger, such as on the order of a megabyte or larger.

The data structure 128 may be considered internal to the non-volatile solid state memory 102 in the sense that the memory controller 108 may rely on the data structure 128 when performing operations on the non-volatile solid state memory 102. The data structure 128 does not necessarily need to be received from the host system 110 in order to perform the operations. For example, the data structure 128 may not include host data received from the host system 110. The data structure 128 may include multiple data structures.

One example of the data structure 128 that is internal to the non-volatile solid state memory 102 may include a mapping between logical data blocks and physical data blocks. The mapping may be stored in the non-volatile solid state memory 102. The memory controller 108 may cache the mapping or a subset of the mapping in the RAM 104 because reading from the non-volatile solid state memory 102 may be slower than reading from the RAM 104.

Another example of the data structure 128 that is internal to the non-volatile solid state memory 102 may include error correction code structures. Error correction codes may be a system in which data is added to host data from which errors in the host data may be detected and corrected. The error correction code structures may include structures used in any error correction algorithm, such as convolutional codes, block codes, Reed-Solomon codes, Hamming codes, or any type of error correction codes. The data structure 128 may be structure on which an implementation of the error correction code algorithm relies in detecting and/or correcting an error in the host data.

A portion 132 of the RAM 104 may be allocated to the memory controller 108 for use solely by the memory controller 108 or for the memory controller 108 and the host system 110 to share. Accordingly, the allocated portion 132 of the RAM 104 may include the reserved portion 130 shared by the memory controller 108 and the host system 110. Alternatively or in addition, the allocated portion 132 of the RAM 104 may include a cache area (not shown) to store data internal to the non-volatile solid state memory 102, such as the data structure 128. The allocated portion 132 may be a fixed size or dynamically sized.

The allocated portion 132 of the RAM 104 may be dynamically allocated or pre-allocated. For example, the allocated portion 132 may be pre-allocated when the memory device 106 is manufactured. Then, during boot or power up of the memory device 106, the memory controller 108 may receive or determine pre-allocated memory addresses for the allocated portion 132. Alternatively or in addition, the CPU 126 of the host system 110 may receive or determine pre-allocated memory addresses for the RAM 104 other than the allocated portion 132.

In another example, the allocated portion 132 may be dynamically allocated. At first, all or part of the RAM 104 may be allocated to the host system 110. The memory controller 108 may monitor usage of the RAM 104 and determine how many memory pages of the RAM 104 may be used for management and/or performance enhancement of the non-volatile solid state memory 102.

Alternatively or in addition, the allocated portion 132 of the RAM 104 may be dynamically allocated. During boot or power up of the memory device 106, the allocated portion 132 may be minimal or non-existent.

The system 100 may be implemented with additional, different, or fewer components. For example, the system 100 may include only the memory controller 108. In an alternative example, the system 100 may include only the host system 110.

Examples of the CPU 126 may include a general processor, a central processing unit, a microcontroller, a server, an application specific integrated circuit (ASIC), a digital signal processor, a field programmable gate array (FPGA), a digital circuit, an analog circuit, or any other type of processor.

The CPU 126 and/or the memory controller 108 may be any type of processor. A processor may be one or more devices operable to execute logic. The logic may include executable instructions or computer code embodied in firmware or in other memory that when executed by the processor, cause the processor to perform the features implemented by the logic.

Each component may include additional, different, or fewer components. For example, the second DDR interface 120 may be used by the memory controller 108 but be a physically discrete component that is separate from the memory controller 108. In another example, the block storage protocol interface 122 may be used by the memory controller 108 but be a physically discrete component that is separate from the memory controller 108.

Regardless of whether the block storage protocol interface 122 and/or the second DDR interface 120 is included in the memory controller 108, the block storage protocol interface 122 and/or the second DDR interface 120 may still be in communication with the memory controller 108. Specifically, if an interface is in communication with the memory controller 108, then one or more components of the memory controller 108 are configured to transmit and/or receive information over the interface.

The first DDR bus 114 and the second DDR bus 116 may be coupled to the RAM 104. The term "coupled" may mean physically coupled and/or electrically coupled.

The system 100 may be implemented in many different ways. Each module, such as the memory controller 108, the DDR interfaces, and the CPU 126, may be hardware or a combination of hardware and software. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the RAM 104, for example, that comprises instructions executable with the processor memory controller 108, the CPU 126 or other processor to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

Logic implemented as computer executable instructions or as data structures in memory may be stored in a computer readable storage medium. Such logic may be stored on, distributed across, or read from one or more types of computer readable storage media. Examples of the computer readable storage medium may include a hard disk, a floppy disk, a CD-ROM, a flash drive, a cache, volatile memory, non-volatile memory, RAM, flash memory, or any other type of computer readable storage medium or storage media. The computer readable storage medium may include any type of non-transitory computer readable medium, such as a CD-ROM, a volatile memory, a non-volatile memory, ROM, RAM, or any other suitable storage device.

The processing capability of the system 100 may be distributed among multiple entities, such as among multiple processors and memories, optionally including multiple distributed processing systems. Parameters, databases, and other data structures may be separately stored and managed, may be incorporated into a single memory or database, may be logically and physically organized in many different ways, and may implemented with different types of data structures such as linked lists, hash tables, or implicit storage mechanisms. Logic, such as programs or circuitry, may be combined or split among multiple programs, distributed across several memories and processors, and may be implemented in a library, such as a shared library (for example, a dynamic link library (DLL)).

Figure 2:
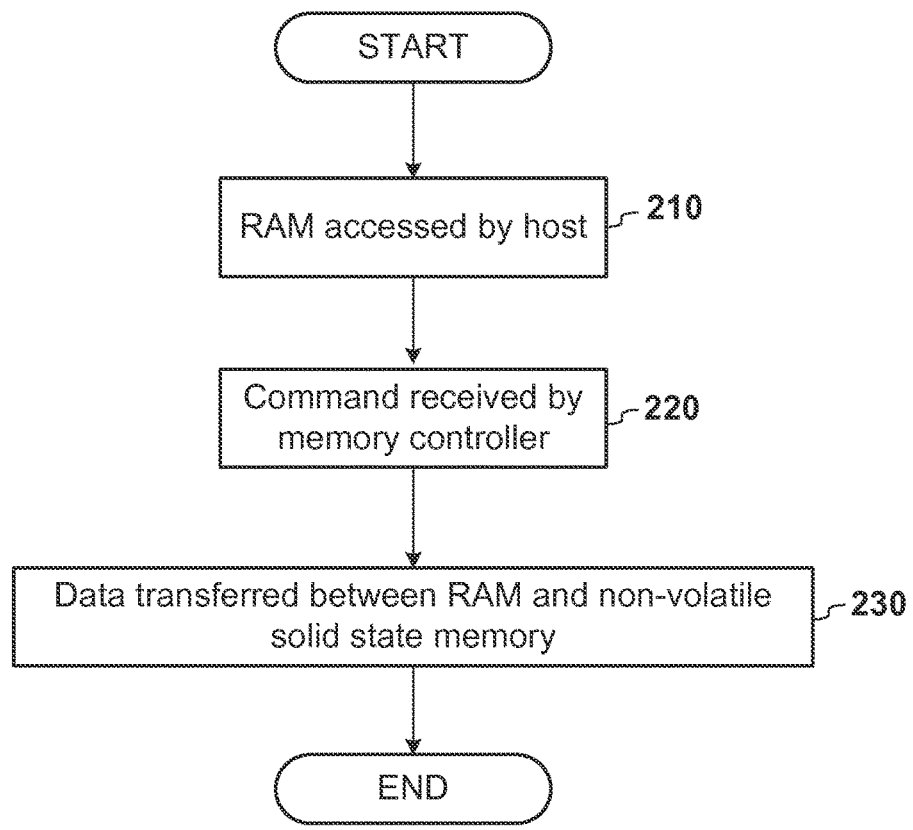
FIG. 2 illustrates a flow diagram of an example of the logic of the system.

FIG. 2 illustrates a flow diagram of an example of the logic of the system 100. The logic may include additional, different, or fewer operations. The operations may be executed in a different order than illustrated in FIG. 2.

Operations may begin by the host system 110 accessing (210) the RAM 104 over first DDR bus 114. For example, the host system 110 may use the RAM 104 as primary memory.

A command may be received (220) at the memory controller 108 from the host system 110 via a bus. For example, the bus may be the block storage protocol bus 124, and the command may be a write or read command that conforms to the block storage protocol.

Data may be transferred (230) by the memory controller 108 between the non-volatile solid state memory 102 and the RAM 104, independently of the CPU 126 of the host system 110, via the second DDR bus 116 in accordance with the command. For example, if the command is a write command, the memory controller 108 may transfer the data from the RAM 104 to the non-volatile solid state memory 102. If the command is a read command, for example, the memory controller 108 may transfer the data from the non-volatile solid state memory 102 to the RAM 104.

In a different example, operations may begin by the host system 110 accessing (210) the RAM 104 over first DDR bus 114. For example, the host system 110 may use the RAM 104 as primary memory. Operations may end by the memory controller 108 caching (not shown) the data structure 128 that is internal to the non-volatile solid state memory 102 in the RAM 104.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

The memory device 106 and/or the non-volatile solid state memory may be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions may also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations may be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories may be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the embodiments as described herein and as understood by one of skill in the art.

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same program or apparatus. The components may be resident on separate hardware, such as separate removable circuit boards, or share common hardware, such as a same memory and processor for implementing instructions from the memory.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

It is intended that the foregoing detailed description be understood as an illustration of selected forms that embodiments may take and not as a definition of all embodiments. Finally, it should be noted that any aspect of any of the embodiments described herein may be used alone or in combination with one another.

While various embodiments have been described, it will be apparent to those of ordinary skill in the art that many more embodiments and implementations are possible. Accordingly, the embodiments described herein are examples, not the only possible embodiments and implementations.

What is claimed is:

1. A memory device comprising:
a random access memory;
a non-volatile solid state memory;
a memory controller configured to access the non-volatile solid state memory;
a first double data rate bus coupled to the random access memory, wherein the random access memory is accessible by a host system via the first double data rate bus;
a second double data rate bus coupled to the random access memory, wherein the random access memory is accessible by the memory controller via the second double data rate bus; and
a block storage protocol interface in communication with the memory controller, wherein the block storage protocol interface and the first double data rate bus are on parallel communication paths from the host system, wherein the memory controller is configured to receive a command from the host system via the block storage protocol interface and to transfer data from the random access memory to the non-volatile solid state memory over the second double data rate bus in response to the command.

2. The memory device of claim 1, wherein the command identifies a location of the data in the random access memory.

3. The memory device of claim 1, wherein the memory device is in a form of a memory card.

4. The memory device of claim 1, wherein the controller comprises an eMMC controller.

5. The memory device of claim 1, wherein the first double data rate bus is configured to couple to an address bus of a central processing unit of the host system.

6. The memory device of claim 1, wherein the command conforms to a data access protocol specified by a memory card standard.

7. The memory device of claim 1, wherein the memory device includes a multi-chip package comprising the random access memory and the non-volatile solid state memory.

8. A method comprising:
receiving, at a memory controller, a command from a host system via an interconnect; and
transferring, by the memory controller, data between a non-volatile solid state memory and a random access memory, independently of a central processing unit of the host system, via a first double data rate bus in accordance with the command, wherein the data in the random access memory is accessible by the host system through a second double data rate bus, and wherein the second double data rate bus and the interconnect are arranged in parallel with respect to the host system.

9. The method of claim 8, wherein the command complies with a block storage protocol.

10. The method of claim 8, wherein transferring comprises writing the data to the non-volatile solid state memory from the random access memory.

11. The method of claim 8, wherein transferring comprises reading the data from the non-volatile solid state memory and storing the data in the random access memory.

12. The method of claim 8 further comprising caching, by the memory controller, a data structure that is internal to the non-volatile solid state memory in the random access memory.

13. The method of claim 8 further comprising identifying, in the command, a memory address of the data in the random access memory.

14. The method of claim 8 further comprising identifying, prior to receiving the command, a memory address of the data in the random access memory.

15. A system comprising:
a block storage protocol interface;
a random access memory accessible via a first double data rate bus and a second double data rate bus;
a non-volatile solid state memory; and
a memory controller configured to read and write to the non-volatile solid state memory, the memory controller further configured to access the random access memory through the second double data rate bus, the memory controller further configured to cache a data structure that is internal to the non-volatile solid state memory in the random access memory, wherein the block storage protocol interface and the first double data rate bus are on parallel communication paths from a host system, wherein the memory controller is configured to receive a command from the host system via the block storage protocol interface and to transfer data from the random access memory to the non-volatile solid state memory over the second double data rate bus in response to the command.

16. The system of claim 15, wherein the data structure is a mapping of logical data blocks to physical data blocks.

17. The system of claim 15 further comprising a multi-chip package that includes the random access memory and the non-volatile solid state memory.

18. The system of claim 15, wherein the non-volatile solid state memory comprises flash memory.

19. The system of claim 15, wherein the random access memory is dynamic random access memory.

20. The system of claim 15, wherein the data structure is an error correction code structure.

21. A memory device comprising:
a random access memory;
a non-volatile solid state memory;
a memory controller configured to access the non-volatile solid state memory;
a first double data rate bus coupled to the random access memory;
a second double data rate bus coupled to the random access memory, wherein the random access memory is accessible by the memory controller via the second double data rate bus; and
a means for communicating with the memory controller in a block storage protocol, the block storage protocol being a protocol in which data is accessed by logical block addresses (LBAs), wherein the means for communicating in the block storage protocol and the first double data rate bus are on parallel communication paths from a host system, wherein the random access memory is configured to be accessed by the host system via the first double data rate bus, wherein the memory controller is configured to be accessed by the host system via the means for communicating in the block storage protocol, wherein the memory controller is configured to receive a command from the host system via the means for communicating in the block storage protocol and to transfer data between the random access memory and the non-volatile solid state memory over the second double data rate bus in response to the command.

* * * * *